United States Patent
Chan et al.

(10) Patent No.: US 6,891,917 B2
(45) Date of Patent: May 10, 2005

(54) SHIFT REGISTER WITH REDUCED AREA AND POWER CONSUMPTION

(75) Inventors: Johnny Chan, Fremont, CA (US); Jeff Ming-Hung Tsai, Santa Clara, CA (US); Philip S. Ng, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/634,596

(22) Filed: Aug. 4, 2003

(65) Prior Publication Data

US 2005/0031068 A1 Feb. 10, 2005

(51) Int. Cl.$^7$ ................................................ G11C 19/00
(52) U.S. Cl. ........................... 377/78; 377/79; 377/80; 377/81; 377/69
(58) Field of Search ..................... 345/99, 100; 377/78, 377/79, 80, 81, 69

(56) References Cited

U.S. PATENT DOCUMENTS

| | | | |
|---|---|---|---|
| 4,446,567 A | * | 5/1984 | Iida et al. .................... 377/79 |
| 4,598,214 A | | 7/1986 | Sexton ....................... 307/291 |
| 4,672,647 A | | 6/1987 | Yamaguchi et al. ........... 377/77 |
| 4,890,308 A | * | 12/1989 | Imai ............................ 377/79 |
| 4,903,285 A | | 2/1990 | Knierim et al. ............... 377/78 |
| 5,150,389 A | | 9/1992 | Kawasaki ..................... 377/67 |
| 5,295,174 A | | 3/1994 | Shimizu ....................... 377/76 |
| 5,381,455 A | | 1/1995 | Ovens et al. ................. 377/67 |
| 6,058,156 A | | 5/2000 | Kanba ......................... 377/78 |

* cited by examiner

*Primary Examiner*—Margaret R. Wambach
(74) *Attorney, Agent, or Firm*—Schneck & Schneck; Thomas Schneck; Mark Protsik

(57) ABSTRACT

A shift register device includes transistor pass gates and latches connected in series and disposed along a data bit line, each latch connected to a corresponding transistor pass gate. Each transistor pass gate is controlled by a separate control signal input line that a provides a signal to the transistor pass gate connected to it. The signals are provided in a staggered time pattern beginning with a latch disposed last in succession, shifting data from one position to the next succeeding position. Each latch is capable of storing one bit of data. The shift register utilizes less silicon space while reducing the amount of power consumed during operation.

22 Claims, 3 Drawing Sheets

SHIFT REGISTER WITH REDUCED AREA AND POWER CONSUMPTION

FIELD OF THE INVENTION

The invention pertains to shift register devices in general, and in particular, to shift register device designs employing latches in a more efficient arrangement.

BACKGROUND OF THE INVENTION

Shift registers are used in many applications in digital circuit designs. A typical prior art shift register 10 is illustrated in FIGS. 1A and 1B. FIG. 1A illustrates a four bit serial shift register including four D-type flip-flops 12, 14, 16, and 18 each with complementary latches 20 and 22, as shown in FIG. 1B. Each flip-flop of the shift register 10 includes a data input terminal D, a pair of clock signal input lines $C_A$ and $C_B$, and a data output terminal Q. The outputs Q of the flip-flops 12, 14, and 16 form the data inputs D for the next or subsequent flip-flop 14, 16, and 18 in the series.

As seen in FIG. 1B, the transfer of data from the data input terminal D into the first latch 20 is controlled by a transistor pass gate 30, and the transfer of data from the first latch 20 into the second latch 22 is controlled by a second transistor pass gate 32. A pair of clock signals CLK and CLKB for the shift register 10 is physically connected to the respective pass gates 30 and 32 of each flip-flop via the clock signal input lines $C_A$ and $C_B$. Each flip-flop is a positive edge triggered flip-flop, which means that data is shifted from input D to output Q on the rise of the clock signal CLK and on the fall of the clock signal CLKB.

FIG. 2 illustrates a partial timing diagram for clock signals CLK and CLKB as applied simultaneously to each flip-flop 12, 14, 16, and 18. As CLK reaches a positive (rise) edge and CLKB reaches a negative (fall) edge the following data transfer occurs. Data DIN is shifted from data input terminal 21 and latched to output $Q_A$ of flip-flop 12 (FIG. 1). Data A, previously stored in flip-flop 12, is shifted and latched to output $Q_B$ of flip-flop 14. Data B, previously stored in flip-flop 14, is shifted and latched to output $Q_C$ of flip-flop 16. Data C, previously stored in flip-flop 16 is transferred and latched to output $Q_D$ of latch 18. Data D, previously stored in latch 18, is shifted out on to data output terminal 23. On the next positive edge of CLK and negative edge of CLKB, data is shifted through to the next subsequent flip-flop. DIN, A, B, C and D represent bit data. DIN, A, B, C and D represent values that may all be the same, different or that may be various combinations of values.

A problem with prior shift devices, like the one just described, is that they take up much silicon space. If the area for one latch (typically 5 transistors) is represented by Y, then the amount of silicon required for a four-bit shift register having two latches per bit stored is Y(area)×2(latches)×4(bits)=8Y. An additional problem with some prior art registers is that much power is consumed where the clock signal input line operates to provide an input clock signal to all of the flip-flops simultaneously.

Therefore, it is an object of the present invention to provide a shift register device that efficiently utilizes silicon space.

It is a further object of the present invention to provide a shift register device that efficiently consumes power during operation.

SUMMARY OF THE INVENTION

These and other objects have been achieved by a shift register device including latches, only one per bit, that are connected in series along a data bit line. Each latch includes a transistor pass gate on its input side that is controlled via a separate control signal input line from that for the pass gates of the other latches. The pass gates are activated in a staggered time pattern, shifting data from one latch to the next, in a reverse order beginning with the last latch in the series and proceeding toward the first latch, which is loaded with a new data bit. The bits stored by each latch are read from a set of output terminals, one for each latch.

Each single latch is capable of storing one bit of data. The shift register device of the present invention utilizes less silicon space. For example, if the area for one latch is represented by Y, then the amount of silicon required for a four bit shift register is Y(area)×4(latches)=4Y. Furthermore, as separate control signals are applied to the series of latches in a staggered manner such that not all of the data is shifted at once, a reduced amount of power is consumed, as compared to shift registers of the prior art.

In one example of the present invention, the shift register includes four latches storing four bits of data total. Upon receipt of a control signal, data stored in a last latch disposed at the end of the series of latches, is replaced with data stored in a preceding latch. Upon receipt of a second control signal, the third latch in the series is loaded with a data bit shifted in from the preceding second latch. Upon receipt of a third control clock signal, data stored in a first latch is shifted into the second latch. Upon receipt of a fourth control signal, the first latch is loaded with a new bit through an input terminal. In this way, four data bits may be stored and shifted in the shift register. Data may be continuously inputted and stored data may be shifted from a preceding latch to a succeeding latch upon repeated application of staggered control signals.

DETAILED DESCRIPTION OF THE INVENTION

Figure 1A:
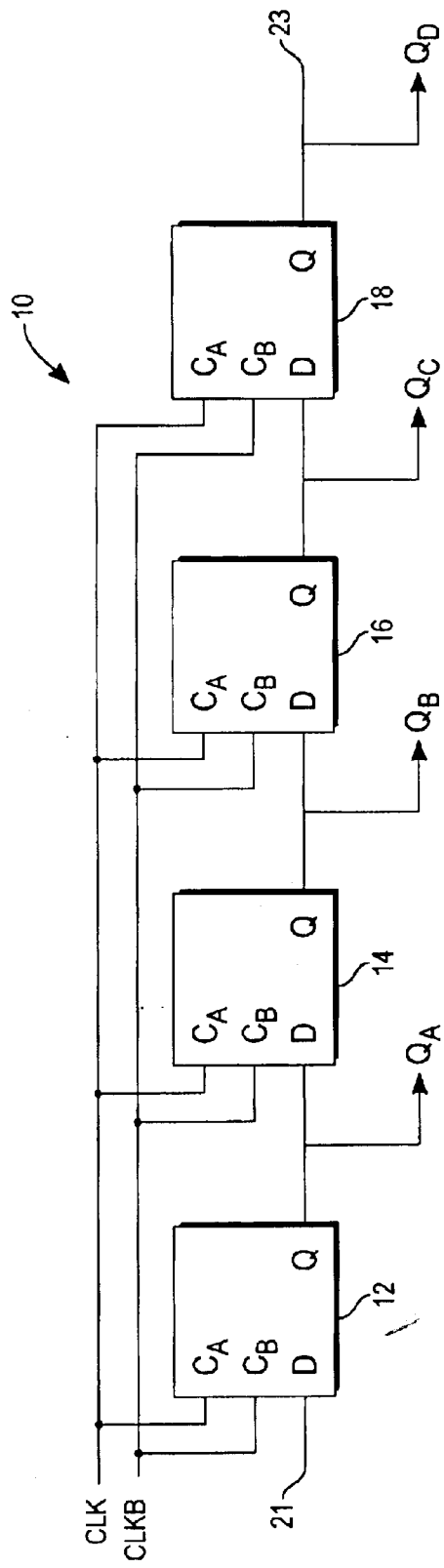
FIG. 1A is a schematic diagram of a prior art shift register.
Figure 1B:
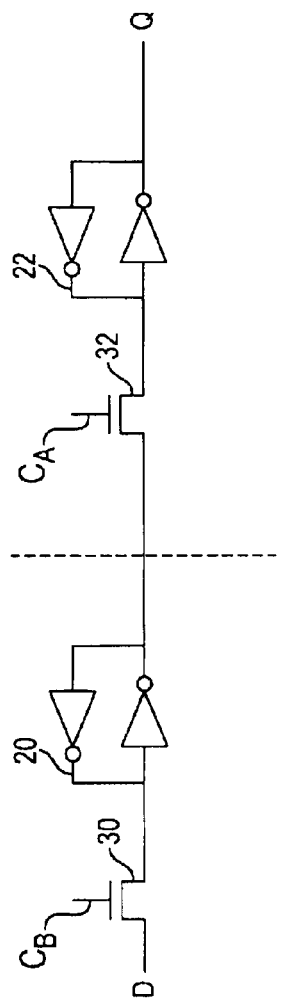
FIG. 1B is a schematic diagram of a prior art flip-flop of the shift register of FIG. 1A.
Figure 2:
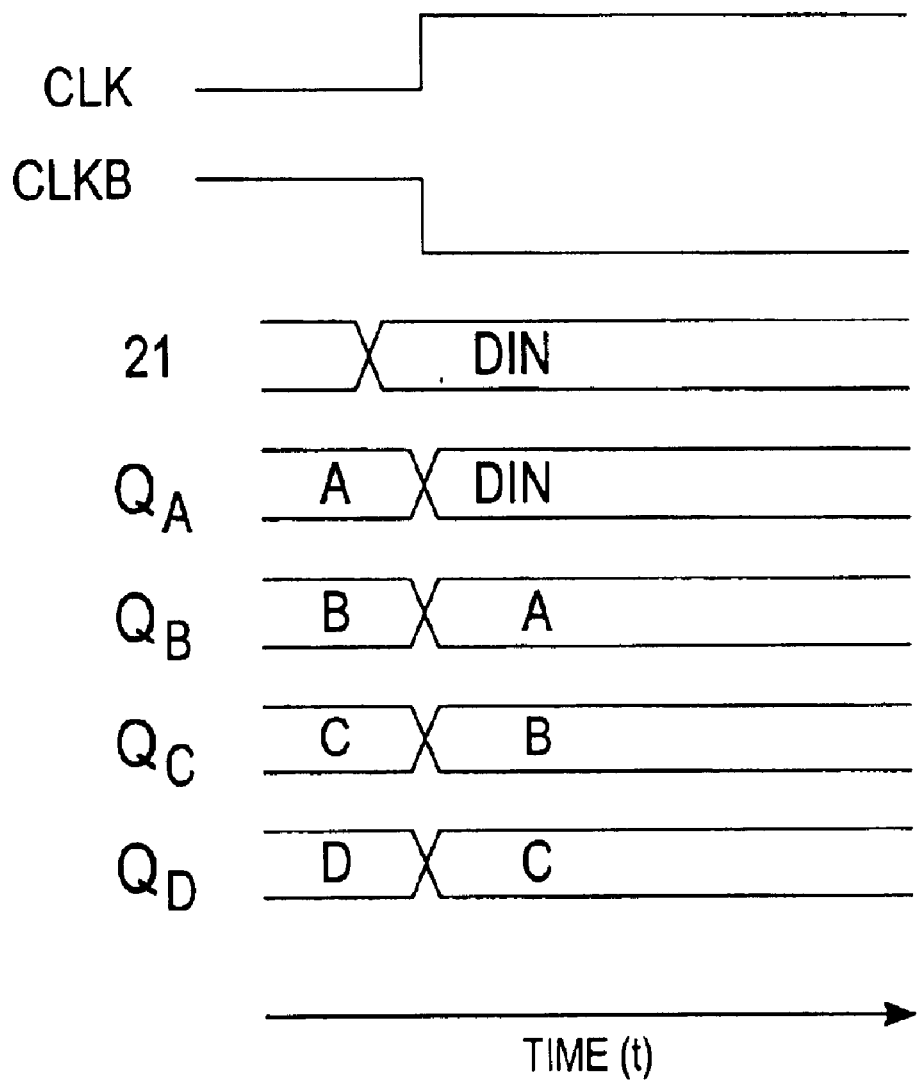
FIG. 2 is a prior art partial timing diagram of the shift register of FIGS. 1A.
Figure 3:
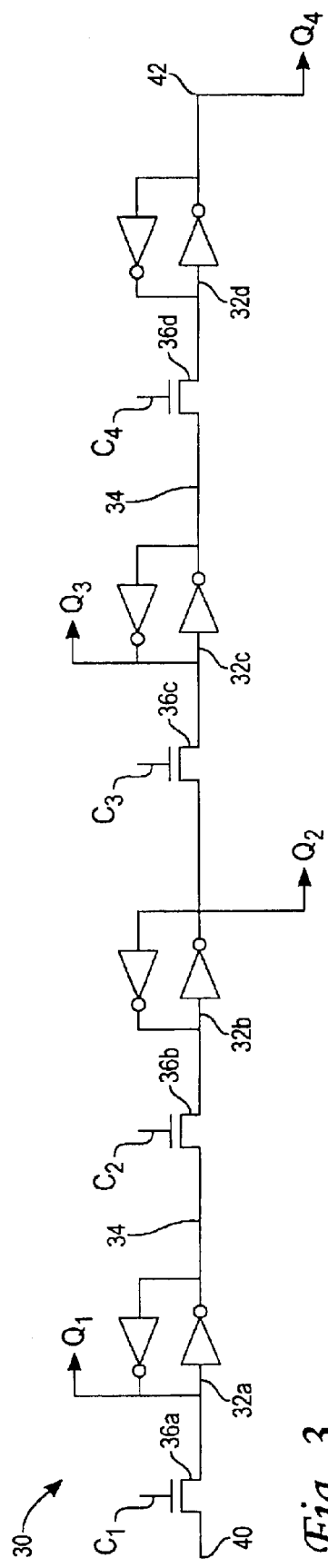
FIG. 3 is a schematic diagram of a shift register of the present invention.

As seen in FIG. 3, a shift register 30 of the present invention includes latches 32a, 32b, 32c and 32d in succession and connected in series along a bit data input line 34 along which bit data is to be shifted to and from latches towards as output terminal 42. In the example depicted in FIG. 3, four latches are present. However, a varying number of latches may be used if desired. Latches 32a–d are disposed between an input terminal 40 and output terminal 42 and are each capable of storing one bit of data. Each latch is connected to one of transistor pass gates 36a, 36b, 36c or 36d on its input side that is controlled via a separate control signal input line $C_1$, $C_2$, $C_3$ or $C_4$ from that of the transistor pass gates of the other latches. Thus, latches 32a–d are connected to control signal input lines $C_1$–$C_4$ through the transistor pass gates. Each control signal input line is operable to provide a control signal to one of transistor pass gates 36a–d. Each control signal, $S_1$, $S_2$, $S_3$ and $S_4$, (FIG. 4) is applied through the corresponding control signal input line in a staggered time pattern. In other words, control signals are applied to each transistor pass gate 36a–d one signal at a time. Control signals $S_1$–$S_4$ are also applied in reverse succession as will be described below.

Figure 4:
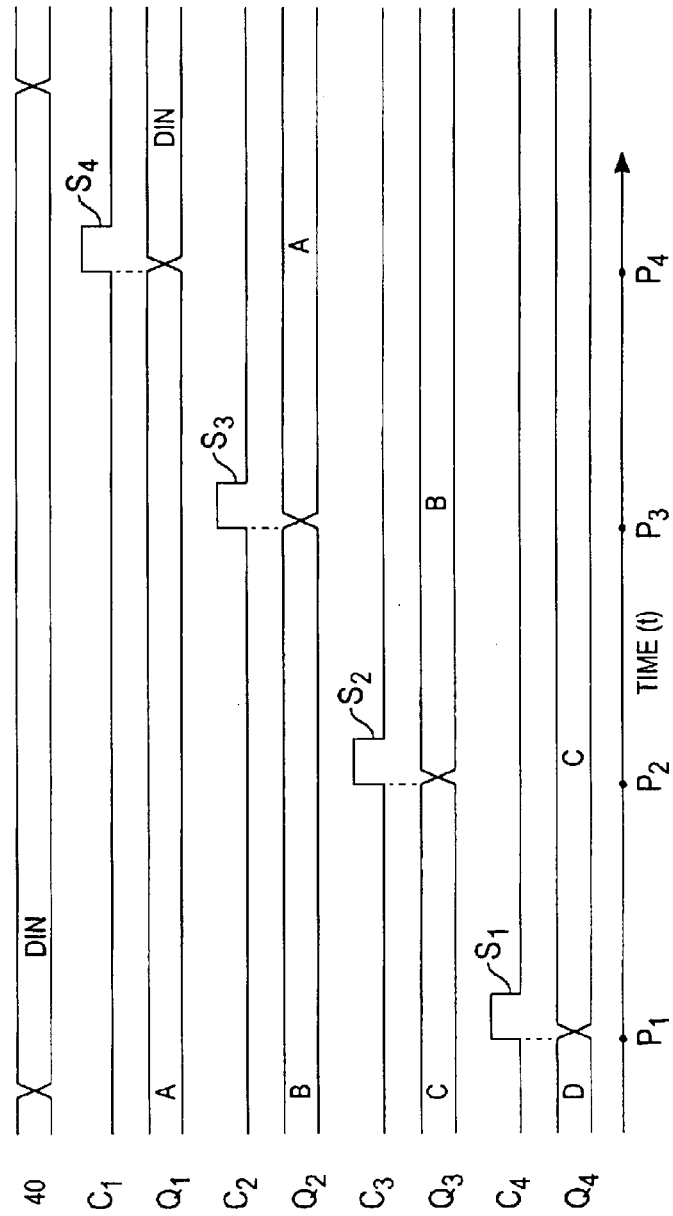
FIG. 4 is a partial timing diagram of the shift register of FIG. 3.

As seen in FIGS. 3 and 4, transistor pass gates and control signal input lines are disposed in succession beginning with transistor pass gate 36a and control signal input line $C_1$ and ending with transistor pass gate 36d and control signal input line $C_4$. Transistor pass gate 36d is disposed between and adjacent to latches 32c and 32d and receives control signal $S_1$ via control signal input line $C_4$, line $C_4$ being connected to transistor pass gate 36d. Transistor pass gate 36d, latch 32d and control signal input line $C_4$ are disposed last in succession. Control signal input line $C_4$ is operable to provide a first control signal $S_1$ to transistor pass gate 36d. Transistor pass gate 36c is disposed between latches 32c and 32b and receives a control signal $S_2$ from control signal input line $C_3$, line $C_3$ being connected to transistor pass gate 36c. Transistor pass gate 36c, latch 32c and control signal input line $C_3$ are disposed second to last in succession. Control signal input line $C_3$ is operable to provide a second control signal $S_2$ to a transistor pass gate 32c. Transistor pass gate 36b is disposed between latches 32b and 32a and receives an control signal $S_3$ from control signal input line $C_2$, line $C_2$ being connected to transistor pass gates 36b. Transistor pass gate 36b, latch 32b and control signal input line $C_2$ are disposed third to last in succession. Control signal input line $C_2$ is operable to provide a third control signal $S_3$ to a transistor pass gate 36b. Transistor pass gate 36a is disposed adjacent to latch 32a and between latch 32a and input data terminal 40 and receives a control signal $S_4$ from control signal input line $C_1$, line $C_1$ being connected to transistor pass gate 36a. Transistor pass gate 36a, latch 32a and control signal input line $C_1$ are disposed fourth to last in succession. Control signal input line $C_1$ is operable to provide a fourth input control signal $S_4$ to a transistor pass gate 32a.

Upon sequential receipt of the control signals $S_1$, $S_2$, $S_3$ and $S_4$, transistor pass gates 36a–d shift data from a preceding latch or preceding position external to the latches, such as input terminal 40, to a succeeding latch or succeeding position external to the latches, such as output terminal 42. Outputs of each latch 36a–d may be measured at locations $Q_1$–$Q_4$ of the shift register, as discussed below with reference to FIG. 4.

As seen in FIG. 4, control signals $S_1$–$S_4$ are applied in a staggered time pattern to the transistor pass gates 36a–d to cause shifting of data DIN, A, B, C and D beginning with the last latch in the succession of latches and ending with the first latch in a succession of latches. DIN, A, B, C and D represent values of bit data that may all be the same, different or any other desired combination. The designations DIN, A, B, C and D are meant to illustrate the transfer of data and are not intended to limit the particular value of data being shifted in the shift register device 30. The control signals $S_1$–$S_4$ are applied at different, staggered points $P_1$–$P_4$ along the time bar (t), thus causing data to be shifted in a staggered manner. In one example, input signal $S_1$ is first provided to transistor pass gate 36d causing data D within latch 32d to shift from latch 36d, to or towards a succeeding position external to said latches, such as data output terminal 42, and causing data C from latch 32c to shift into latch 32d. FIG. 4 indicates that the output measured at location $Q_4$ has changed from D to C upon application of control signal $S_1$. After application of input clock signal $S_1$, control signal $S_2$ is provided to transistor pass gate 36c causing data B from latch 32b to shift into latch 32c. FIG. 4 indicates that the output measured at location $Q_3$ has changed from C to B upon application of control signal $S_2$. After application of control signal $S_2$, control signal $S_3$ is provided to transistor pass gate 36b causing data A from latch 32a to shift into latch 32b. FIG. 4 indicates that the output measured at location $Q_2$ has changed from B to A. After application of control signal $S_3$, control signal $S_4$ is provided to transistor pass gate 36a causing data DIN, at a position preceding and external to latch 32a such as data input terminal 40, to shift into latch 32a. FIG. 4 indicates that the output measured at location $Q_1$ has changed from A to DIN. FIG. 4 also indicates that input data terminal 40 has had data DIN shifted from it.

FIG. 4 indicates that control signal $S_1$ is provided to transistor pass gate 36d, before control signal $S_2$ is provided to transistor pass gate 36c, before control signal $S_3$ is provided to transistor pass gate 36b and before control signal $S_4$ is provided to transistor pass gate 36a. Control signal $S_2$ is provided to transistor pass gate 36c, before control signal $S_3$ is provided to transistor pass gate 36b and before control signal $S_4$ is provided to transistor pass gate 36a. Control signal $S_3$ is provided to transistor pass gate 36b before input clock signal $S_4$ is provided to transistor pass gate 36a. Control signal $S_4$ is provided to transistor pass gate 36a after input signals $S_1$–$S_3$ have been provided. Application of one or more input signals $S_1$–$S_4$ may be repeated a desired number of times.

As adjoining latches of the shift register device 30 are connected in series and separate clock signals are applied in a staggered manner such that not all of the data is shifted at once, a reduced amount of power is consumed as compared to shift registers of the prior art. Further as, only one latch is used per bit of data stored, the amount of area of silicon required for the shift register is reduced.

What is claimed is:

1. A shift register device comprising:
    a bit data input line along which bit data is to be shifted toward an output terminal;
    latches in succession connected in series along said bit data input line and disposed between an input terminal and said output terminal, each latch capable of storing one bit of data;
    transistor pass gates; and
    control signal input lines connected to said transistor pass gates, each control signal input line operable to provide a control signal to one of said transistor pass gates to shift bit data to and from said latches along said bit data input line, wherein said control signals are applied in a staggered time pattern.

2. The shift register device of claim 1, wherein said bit data is shifted from a preceding latch to a succeeding latch.

3. The shift register device of claim 2, wherein said bit data is shifted from a preceding latch to a position external to said latches.

4. The shift register device of claim 3, wherein said bit data is shifted from a position external to said latches to a succeeding latch.

5. The shift register device according to claim 1, wherein said device is capable of storing four bits of data.

6. The shift register device according to claim 1, wherein said device includes four latches and four control signal input lines in succession.

7. The shift register device according to claim 6, wherein a control signal input line disposed last in succession is operable to provide a first control signal to a transistor pass gate disposed last in succession, a control signal input line disposed second to last in succession is operable to provide a second control signal to a transistor pass gate disposed second to last in succession, a control signal input line disposed third to last in succession is operable to provide a third control signal to a transistor pass gate disposed third to last in succession, and a control signal input line disposed fourth to last in succession is operable to provide a fourth control signal to a transistor pass gate disposed fourth to last in succession.

8. The shift register device according to claim 7, wherein said first control signal is provided before said second control signal, said second control signal is provided before said third control signal, and said third control signal is provided before said fourth control signal.

9. The shift register device of claim 7, wherein said transistor pass gate disposed last in succession is disposed between a latch disposed last in succession and a latch disposed second to last in succession.

10. The shift register device of claim 9, wherein said transistor pass gate disposed second to last in succession is disposed between said latch disposed second to last in succession and a latch disposed third to last in succession.

11. The shift register device of claim 10, wherein said transistor pass gate disposed third to last in succession is disposed between said latch disposed third to last in succession and a latch disposed fourth to last in succession.

12. The shift register device of claim 11, wherein said transistor pass gate disposed fourth to last in succession is disposed between said input terminal and said latch disposed fourth to last in succession.

13. The shift register device of claim 1, wherein said control signals are applied in succession beginning with application to a transistor pass gate disposed last in succession.

14. A method for driving a shift register device, said device comprising a bit data input line along which bit data is to be shifted toward an output terminal, a succession of latches capable of storing one bit of data, said latches connected in series along said bit data input line and disposed between an input terminal and said output terminal, a succession of transistor pass gates, and a succession of clock signal input lines, each of said clock signal input lines connected to one of said transistor pass gates, each clock signal input line operable to provide an input clock signal to one of said transistor pass gates to shift bit data upon receipt of said input clock signal, comprising the steps of:

a) providing a first control signal to a transistor pass gate disposed last in succession via a control signal input line disposed last in succession;

b) shifting bit data from a latch disposed last in succession towards said output terminal upon providing said first control signal;

c) shifting bit data from a latch disposed second to last in succession to said latch disposed last in succession upon providing said first input clock signal;

d) providing a second control signal to a transistor pass gate disposed second to last in succession via a control signal input line disposed second to last in succession; and e) shifting bit data from a latch disposed third to last in succession to said latch disposed second to last in succession upon providing said second control signal, wherein said first and second control signals are provided in a staggered time pattern and said first control signal is provided before said second control signal.

15. The method of claim 14, further comprising the steps of:

f) providing a third control signal to a transistor pass gate disposed third in succession via a control signal input line disposed third in succession;

g) shifting bit data from a latch disposed fourth to last in succession to said latch disposed third to last in succession upon providing said third control signal;

h) providing a fourth control signal to a transistor pass gate disposed fourth to last in succession via a control signal input line disposed fourth to last in succession; and i) shifting input data to said latch disposed fourth to last in succession upon providing said fourth control signal, wherein said third and fourth control signals are provided in a staggered time pattern and said third control signal is provided before said fourth control signal.

16. The method according to claim 14, wherein steps a) to c) occur before steps d) and e).

17. The method according to claim 15, wherein steps a) to c) occur before steps d) and e) and steps f) and g) occur before steps h) and i) but after steps a) to e).

18. The method according to claim 15, further comprising repeating said steps a) to i).

19. A shift register device comprising:

latches in succession and connected in series along a bit data input line, each latch storing one bit of data; and control signal input lines in succession connected to said latches, each line operable to provide a control signal to shift bit data along said bit data input line, wherein said control signals are applied in a staggered time pattern and in reverse succession.

20. The shift register device of claim 19, further comprising transistor pass gates connected to said control signal input lines, wherein said control signal input lines operate through said transistor pass gates.

21. The shift register device of claim 19, wherein said device includes four latches and four control signals.

22. The shift register device according to claim 21, further comprising four transistor pass gates, each transistor pass gate connected to one of said control signal input lines.

* * * * *